United States Patent [19]

Kushner et al.

[11] Patent Number: 5,038,100
[45] Date of Patent: Aug. 6, 1991

[54] MICROWAVE TEST FIXTURE

[75] Inventors: Lawrence J. Kushner, Haverhill; Robert Beaudette, Acton, both of Mass.

[73] Assignee: Massachusetts Institute of Technology, Cambridge, Mass.

[21] Appl. No.: 357,081

[22] Filed: May 25, 1989

[51] Int. Cl.$^5$ .......................... G01R 31/02; H01P 3/08
[52] U.S. Cl. ................................ 324/158 F; 333/246; 333/260
[58] Field of Search ................. 324/158 F; 200/243; 333/27, 105, 238, 246, 260

[56] References Cited

U.S. PATENT DOCUMENTS

| | | | |
|---|---|---|---|
| 2,854,543 | 9/1958 | Wilson | 333/105 |
| 3,590,377 | 7/1968 | Sorger . | |
| 4,046,982 | 9/1977 | Schadow et al. | 200/243 |
| 4,365,195 | 12/1982 | Stegens . | |
| 4,595,893 | 6/1986 | Charbonnier et al. | 333/105 |
| 4,707,656 | 11/1987 | Marzan . | |
| 4,808,919 | 2/1989 | Sylviane et al. | 333/246 |
| 4,810,981 | 3/1989 | Herstein | 333/27 |
| 4,816,789 | 3/1989 | Mars | 333/246 |

FOREIGN PATENT DOCUMENTS 2177253 1/1987 United Kingdom ............ 324/158 P

OTHER PUBLICATIONS

Herstein, D.; "Evaluating and . . . "; MSN & CT; Apr. 1988; pp. 65, 67, 69-71.
Design Technique Promotional Literature; "Microstrip . . . "; Design Technique, Northridge, Calif.; pp. 1-4; 1986.
Hughes Promotional Literature; "Microwave Test . . . "; Hughes Aircraft Co., Torrance, Calif.; pp. 1-5; date unknown.
Ross et al.; "A Broadband . . . "; *Microwave Journal*; May 1987; pp. 233-248.
Transistor Test Fixture; Maury Microwave Corporation Product Literature; Maury Microwave Corp.; Cucamonga, Calif.; Jan. 1983; pp. 1-4.
Intercontinental Microwave Product Literature; Intercontinental Microwave Co.; pp. 1-15; date unknown.

*Primary Examiner*—Ernest F. Karlsen
*Attorney, Agent, or Firm*—Hamilton, Brook, Smith & Reynolds

[57] ABSTRACT

A microwave test fixture has two coaxial input connectors electrically coupled to fixture microstrips. A recessed mounting slot is located between the working surfaces on which the microstrips are mounted. An electrical device on a carrier is mounted in the mounting slot. A flexible interconnect is mounted on mounting pins on either side of the mounting slot such that each interconnect overlaps a junction between a fixture microstrip and a microstrip on the device. On the bottom side of each interconnect is a printed conductor. Spring-loaded contact pieces apply pressure to the top of each interconnect causing the printed conductor to simultaneously make conductive contact with a fixture microstrip and a microstrip of the device.

18 Claims, 4 Drawing Sheets

MICROWAVE TEST FIXTURE

BACKGROUND OF THE INVENTION

The Government has rights in this invention pursuant to contract Number F19628-85-C-0002 awarded by the Department of the Air Force.

In the microwave industry, a large number of devices and circuits are connectorless components on flat substrate carriers. Because microwave signals are typically transmitted on low-loss coaxial cables, the testing of these "drop-in" components with a microwave signal requires that the signal source be transformed from the coaxial domain to a form which may be coupled to the device in question. Such a transformation is often performed by a test fixture having a coaxial input connector which is converted to another form of conductor to be directly connected to the microwave device.

In the past, microwave test fixtures have used a variety of methods and connectors to couple the test signal to the device being tested. Most of these have involved some sort of adhering connection to the device such as wire-bonds, ribbon-bonds, gap-welds, and soldering. These connections, although reasonably effective, are neither quick to perform nor repeatable. There is only a limited number of times that such a connection can be performed before the fixture, the carrier, or the device under test is permanently damaged.

Other types of fixtures require precision machining of the fixture components in order to function properly. The tight tolerances on the fixture, the carrier holder, the device contacts, and other components make the production of these test fixtures difficult and expensive. Pressure contacts cause wear in the fixtures after repeated use, and the precision nature of the fixture components makes their replacement costly.

Thus, there is a need for a microwave test fixture that provides a repeatable measurement of the carrier or device under test, that does not damage or alter the fixture or the device, and can be used for a large number of tests prior to replacement.

SUMMARY OF THE INVENTION

A test fixture is provided which allows electrical contact between two adjacent surface conductors for the measuring of an electrical circuit which is contacted by one of the conductors. A coaxial to microstrip transition joins a coaxial input connector to a microstrip which lies adjacent to a mounting slot on the fixture. The mounting slot provides support for a carrier having an electrical circuit to be tested. With the carrier properly inserted into the mounting slot, the fixture microstrip and a microstrip on the carrier are substantially aligned with one another. A flexible interconnect is mounted to the fixture such that it overlaps a junction between the two microstrips. The interconnect has a printed conductor on the side facing the two microstrips. A pressure source applies pressure to a portion of the interconnect, causing it to compress onto both sides of the junction. The interconnect bends under pressure such that the printed conductor makes conductive contact with the two microstrips, thereby forming an electrical connection between the microstrips over which a microwave test signal can be transmitted.

By using an interconnect for each of two microstrips on a single carrier, two connections to the carrier device are created and the circuit may be accurately tested. The carrier resides in a presized slot which keeps the carrier microstrips substantially aligned with the printed conductors of the interconnects while they are in the secured position. In the present embodiment each flexible interconnect is secured by two pins from which it is easily removed. The interconnects are held in pressure contact with the fixture and the carrier by spring-loaded shafts. A cam and lever system easily lifts the shafts away from the interconnects allowing their removal. In place of the pins, and the cam and lever system, any number of mechanized assemblies can be used to position the interconnects and apply the necessary pressure to achieve contact.

A method of measuring the characteristics of an electronic device, as provided with the present invention, involves attaching coaxial test cables to a test fixture. The coaxial input connectors of the test fixture are coupled to fixture microstrips by coaxial to microstrip transitions. A carrier is inserted in a mounting slot of the fixture, and microstrips on the carrier are aligned with the microstrips of the fixture. Once aligned, the carrier is secured in the mounting slot and flexible interconnects having printed conductive strips are placed over securing pins of the test fixture adjacent the mounting slot. A pressure source is then applied to the interconnects, pressing the conductive strip of each interconnect into conductive contact with a fixture microstrip and a carrier microstrip. Thus, each flexible interconnect bridges an electrical connection between the carrier and the fixture. Test signals are input to the carrier device through the test cables and test data is recorded. When testing is complete, the pressure source is removed and the interconnects are lifted away from the test fixture surface. The carrier is then removed and replaced with another carrier device to be tested.

The present invention provides a dependable test fixture and a repeatable method of testing microwave components which does not damage the carrier device or the test fixture. The carrier is easily inserted and removed, and the wear on the system is only on the flexible interconnects. The interconnects are reasonably durable, but if necessary they are easily and inexpensively replaced.

The above and other features of the invention including various novel details of construction and combinations of parts will now be more particularly described with reference to the accompanying drawings and pointed out in the claims. It will be understood that the particular test fixture embodying the invention is shown by way of illustration only and not as a limitation of the invention. The principles and features of this invention may be employed in varied and numerous embodiments without departing from the scope of the invention.

DETAILED DESCRIPTION OF THE PREFERRED EMBODIMENTS

Figure 1:
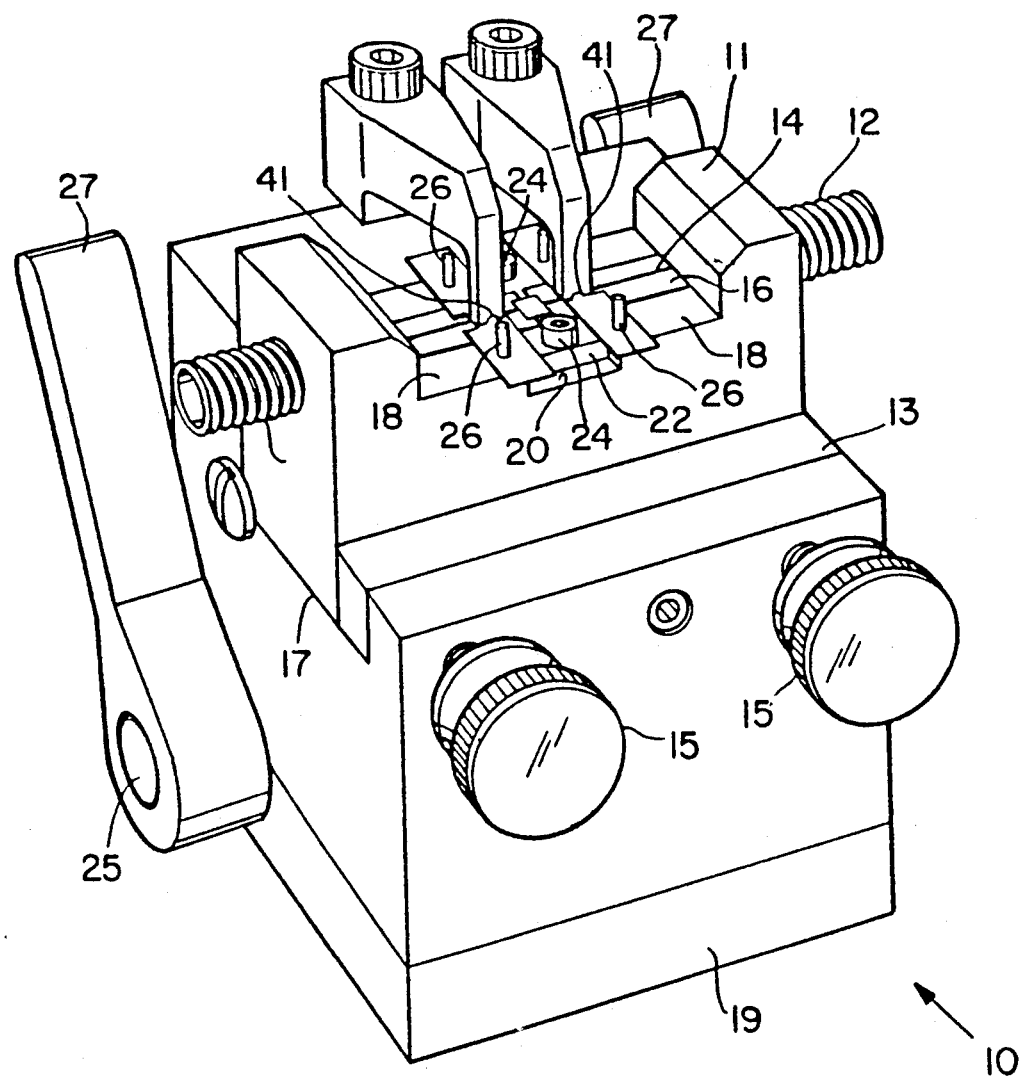
FIG. 1 is a front perspective view of a microwave test fixture.

In FIG. 1 a preferred embodiment of a microwave test fixture 10 is shown. A removable fitting 11 is mounted in the fixture 10 having coaxial connectors 12 at each end. The fixture has a removable base 19 which when removed exposes a lever and cam mechanism to be described below. The fitting 11 is held in place by block 13 which is pressed tightly against the bottom section of fitting 11 by thumb screws 15 which extend through the fixture to the block. Loosening the thumb screws 15 allows the fitting 11 to slide laterally out of the slot 17 in which it is housed. Each coaxial connector 12 of fitting 11 is coupled to a microstrip by a coaxial to microstrip transition.

Figure 2:
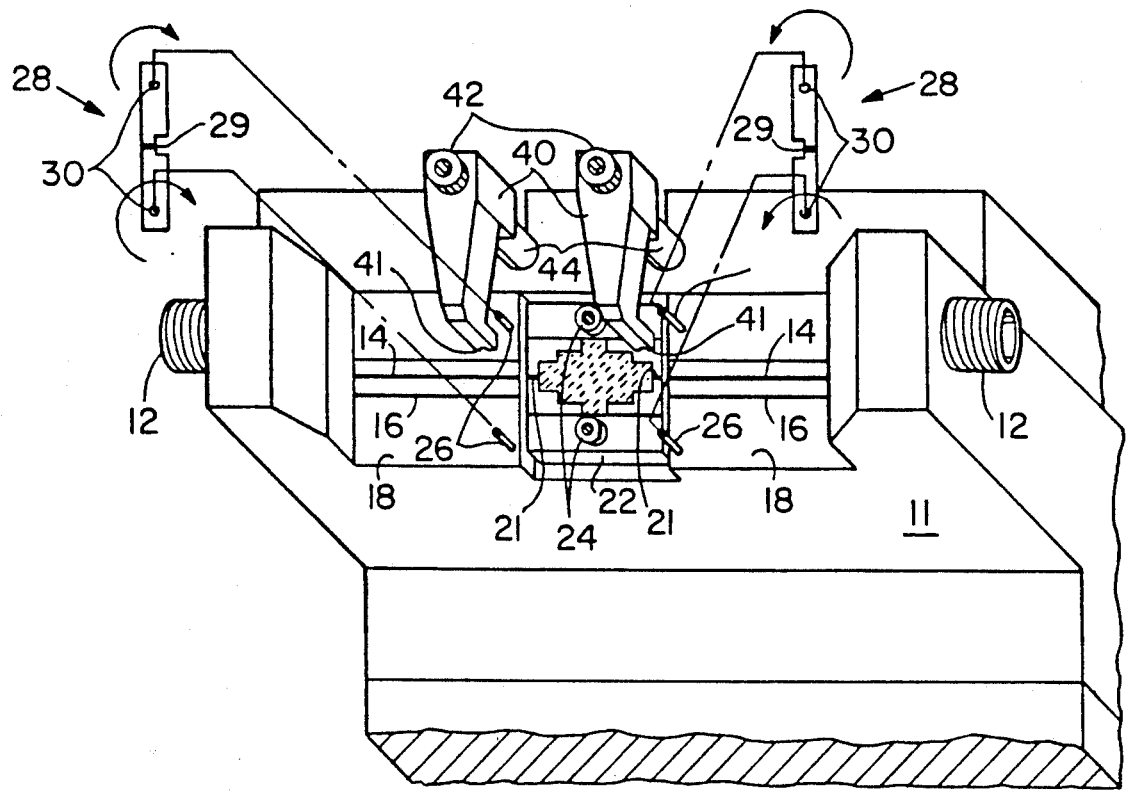
FIG. 2 is an enlarged perspective view of the microwave test fixture of FIG. 1 with the flexible interconnect portions removed.

FIG. 2 is an enlarged perspective view of the front of the test fixture 10. The microstrips 14 of the fixture 10 are each set on a flat working surface 18. In the present embodiment, a portion 16 of the working surface 18 surrounding each microstrip 14 is a material having a high dielectric constant. By keeping the dielectric constant of the working surface portion 16 relatively high, reflections in the microstrip are reduced.

A mounting slot 20 in the fitting 11 is sized to fit a flat microwave carrier 22 such that the microstrips on the carrier 22 are adjacent to the fixture microstrips and substantially level with the working surfaces 18. The carrier 22 has two mounting screws 24 which hold it secured within the mounting slot 20. Microstrips 21 on the carrier 22 are located adjacent to the working surfaces 18 and aligned with the fixture microstrips 14.

Projecting from each working surface 18 are a pair of mounting pins 26 which have vertical axes perpendicular to the working surfaces 18. Each pair of pins 26 is oriented adjacent to the mounting slot 20 with one on either side of a microstrip 14. Mounted on each pair of pins 26 is a flexible interconnect 28 made of a material having a low dielectric constant. In the present embodiment the interconnect material is DUROID ®, a registered trademark of Rogers Corporation. Each interconnect 28 is secured to one pair of pins 26 such that the body of the interconnect 28 overlaps a junction between the top of the carrier 22 and one of the working surfaces 18.

As shown in FIG. 2, the underside of each interconnect 28 has a printed conductor 29 positioned between pin holes 30 of the interconnect 28 such that when mounted on pins 26 the printed conductor 29 overlaps both carrier microstrip 21 and a fixture microstrip 14. The printed conductor 29 is typically highly conductive metal and in the present embodiment it is gold-plated copper. When pressure is applied to the top side of the interconnect 28, it is pressed into engagement with the carrier 22 and the working surface 18. When such pressure is applied, the printed conductor 29 provides a bridge through which an electrical connection is made between a carrier microstrip 21 and a fixture microstrip 14. Thus, a connection is made from a coaxial connector 12 through fixture microstrip 14 and onto the surface of carrier 22 without welding, soldering, or otherwise bonding a connector to the surface of the carrier 22.

In order to provide enough pressure to the flexible interconnects 28 such that the printed conductor 29 makes a good electrical connection between the fixture microstrip 14 and the carrier microstrip 21, REXOLITE ® contact pieces 40 attached to vertical shafts 44 are mounted to the fixture 10. Shafts 44 pass through the body of the fixture 10 and are part of a spring-loaded lever and cam system which raises the shafts up and down. Each contact piece 40 is aligned such that in the down position it contacts an interconnect 28 on the side opposite the printed conductor 29. The REXOLITE ® material is chosen for its low dielectric constant, low loss, relative rigidity and machinability.

As can be seen in FIGS. 1 and 2, the tip 41 of each contact piece 40 is shaped somewhat like an inverted "U". The shape causes the pressure of the contact piece 40 to be concentrated on the two portions of the interconnect overlying the ends of the printed conductor 29 which make contact with the fixture microstrip 14 and the adjacent carrier microstrip 21.

The levers 27 shown in FIG. 1 operate a cam system within the body of the fixture which controls the action of the shafts 44. The levers 27 are shown in their upright position in FIG. 1. Each lever controls one of the shafts 44. When pressure is applied to the lever in a direction toward the back of the fixture 10, the lever rotates around cam shaft 25 to rotate a cam 50 within the body of the fixture and raise a respective shaft 44, as shown in FIG. 3.

Figure 3:
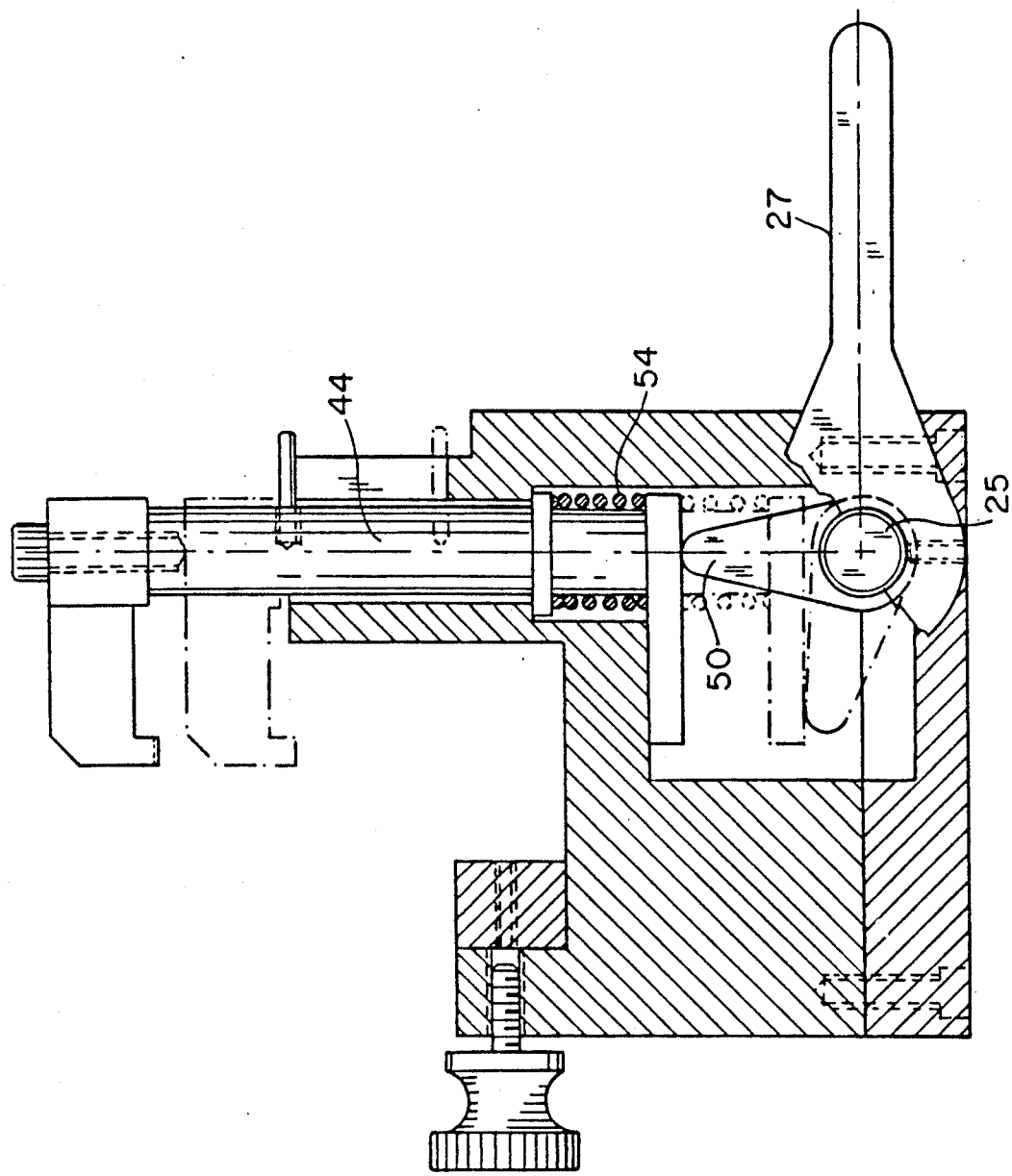
FIG. 3 is a cross sectional view of the microwave test fixture of FIG. 1.

The cross sectional side view of FIG. 3 shows the internal workings of the lever and cam mechanism. When the lever 27 is rotated about shaft 25, cam 50 rotates with the shaft 25 forcing platform 52 to compress the spring 54 and raise the shaft 44. Coil spring 54 provides enough tension to hold the contact piece 40 firmly against the flexible interconnect 28 when the cam 50 is in its down position.

In a typical testing situation, coaxial leads from the testing equipment are attached to each of the coaxial input connectors 12 of FIGS. 1 and 2. The carrier 22 bearing the device to be tested is then placed in the mounting slot 20 and aligned such that its microstrips 21 are in line with the fixture microstrips 14. Once aligned, the carrier 22 is secured by holding screws 24 which keep the carrier from moving around in mounting slot 20. With the fixture and components aligned as in FIG. 2, the flexible interconnects 28 are placed over mounting pins 26 with printed conductors 29 facing the fixture. The REXOLITE ® contact pieces 40 are in their up position during this alignment process. Once the interconnects 28 are in place, the levers are brought back to their up positions causing the contact pieces 40 to move downward, making contact with and applying pressure to the interconnects 28. The U-shaped tips of the contact pieces 40 cause the printed conductor 29 of each interconnect 28 to make firm electrical contact with its respective fixture microstrip 14 and carrier microstrip 21. The test fixture 10 is now in the position as shown in FIG. 1, and a test signal may be applied through the coaxial inputs to test the microwave carrier device. Once the pertinent data is obtained from the test, the levers 27 are moved back to their downward position raising the contact pieces 40. The interconnects 28 are removed from the mounting pins and the carrier is replaced with a new carrier.

Figure 4:
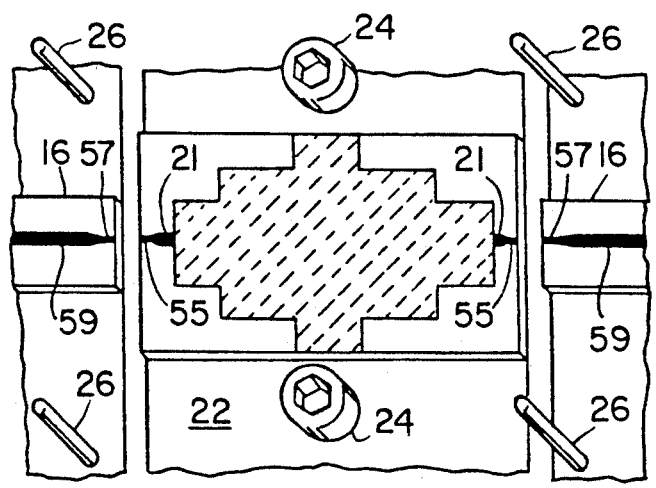
FIG. 4 is a perspective view illustrating an embodiment employing tapered microstrips beneath the interconnects.

In FIG. 4 is shown another alternative embodiment of the test fixture. In this embodiment the fixture microstrips 59 have tapered regions 57 near the mounting slot to improve the transmission characteristics of the microstrip/interconnect junction. The carrier can also have tapered regions 55. Such tapering is particularly effective in reducing reflection when the drop-in component being tested has a substrate with a low dielectric constant. The tapering helps reduce the effect of the discontinuity in the surrounding dielectric material by providing an improved impedance match across the junction.

Figure 5:
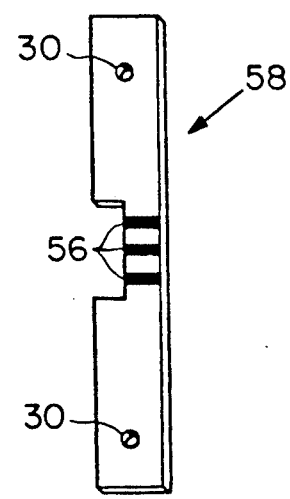
FIG. 5 is an enlarged view of an interconnect having multiple microstrip conductors.

In an alternative embodiment, the flexible interconnects of the test fixture have multiple conductors printed on them. In FIG. 5, an interconnect is shown having three printed conductors 56. The interconnect fits on a test fixture (not shown) very similar to the test fixture 10 of FIG. 2. However, to accommodate the interconnect 58, the fixture requires three microstrips attaching to three external test points. Such a fixture is used to test a device in the mounting slot having more than one surface conductor on one side of the carrier. The multiple conductor interconnect 58 is also used in testing several devices in the mounting slot simultaneously. With each conductor 56 connecting an output from each device to a different microstrip, different test signals are applied to the devices to test them independently.

Figure 6:
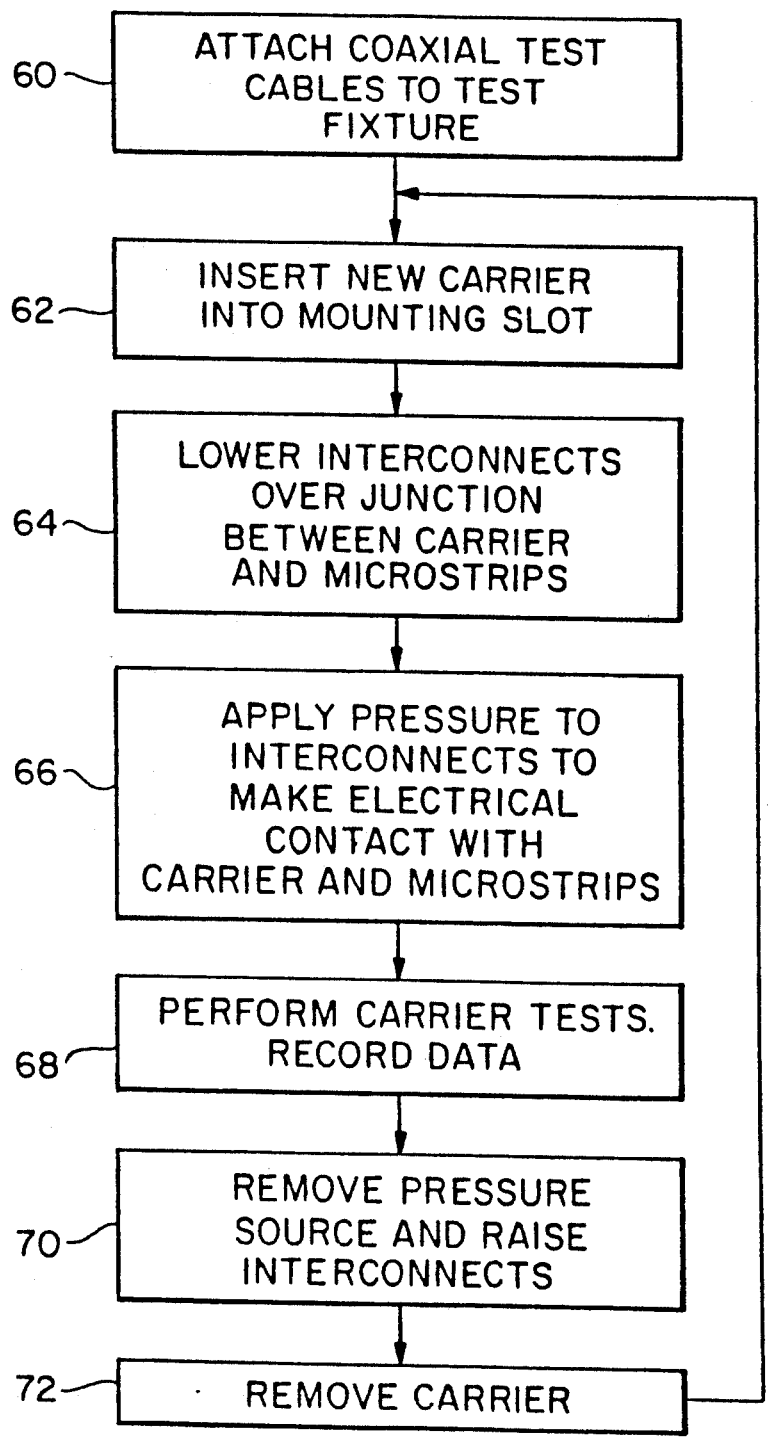
FIG. 6 is a block diagram of a preferred testing method using a microwave test fixture.

Another alternative embodiment of the invention involves an automated testing apparatus. The test fixture of the automated apparatus functionally resembles the manual fixture, but the changing of the carrier and the moving of most parts on the fixture is accomplished by automated equipment. Following a method outlined in FIG. 6, the coaxial cables are attached to the fixture in step 60 by hand, or they may be permanently attached. In step 62, a robot arm grips the carrier and inserts it into the mounting slot of the fixture. The interconnects are then lowered over the junctions between the fixture microstrips and the carrier microstrips in step 64 such that the printed conductors on the bottom of the interconnects align with the microstrips. It is not necessary that the interconnects be mounted on mounting pins in the automated test apparatus, since the automated device holding the each interconnect is aligned with the fixture.

An alignment method such as optical sensing is provided for the carrier to make sure that the carrier microstrips line up with the printed conductors of the interconnects. In step 66, the testing apparatus applies pressure to the critical points of the interconnects to press the printed conductors into electrical connection with the fixture microstrips and carrier microstrips. The pressure may be applied by the same apparatus holding the interconnects or by extensions thereof. Once electrical contact is made, tests are performed in step 68 and any pertinent data is recorded. When the tests are complete, the pressure source is removed and the interconnects are lifted away from the carrier, as shown in step 70. The carrier is then removed in step 72 and the procedure is repeated, with the automated equipment returning to step 62 and inserting a new carrier in the mounting slot.

In order to properly accomodate microwave range frequencies in the test fixture 10, elements of the test fixture are chosen with regard to conductivity and dielectric constant. At microwave frequencies, a common problem in conductor junctions is signal reflections. A change in conductor shape, a change in conductor material, or a change in the dielectric constant of the surrounding material, which upsets the field pattern generated by the signal, can cause unwanted reflections. Consequently, the components of the test fixture 10 are selected to best alleviate this problem. The fixture microstrips 18 and the printed conductors 29 on the interconnects 28 are gold-plated copper for high conductivity. The working surface portions 16 are alumina, which has a high dielectric constant, and the DUROID® substrates 28 have a low dielectric constant. The reflected power at the microstrip/interconnect junction is therefore low. The REXOLITE® contact pieces 40 also have a low dielectric constant so as not to cause any reflections in the region of the interconnects 28.

While the invention has been particularly shown and described with reference to a preferred embodiment thereof, it will be understood by those skilled in the art that various changes in form and details may be made therein without departing from the spirit and scope of the invention as defined by the appended claims. For example, any devices having surface conductors and fitting within the mounting slot 20 may be tested using the test fixture 10, not just those operating at microwave frequencies. In addition, the concept of using a flexible interconnect with a printed conductive strip to make an electrical connection between two surface conductors can be extended to circumstances other than testing microwave components. Also, a single interconnect could have multiple printed conductors for connecting to a device having multiple microstrips on one side. The multiple conductor interconnect can also make connection to a number of different components simultaneously. In either case, the test fixture would accomodate as many microstrips as necessary.

The materials have been chosen to best suit the transmission of microwave signals, but other materials can be used depending on the specific application. Alternative pressure means may be used in place of the spring-loaded pressure contacts 40. Also, the coaxial to microstrip transitions can take a number of different forms and portions of the fixture microstrips 14 can be tapered to improve transmission characteristics.

We claim:

1. A device for making an electrical connection between first and second adjacent surface conductors to measure electrical circuit performance, the device comprising:
   an electrical circuit to be measured having a first microstrip surface conductor;
   a second microstrip surface conductor positioned adjacent to the first surface conductor;
   an interconnect having a flexible body and a conductor that is positioned over the first and second adjacent surface conductors; and
   a pressure source external to the interconnect to apply direct pressure to portions of the interconnect over both the first adjacent surface conductor and the second adjacent surface conductor, said pressure causing the body of the interconnect to bend to contact each of the two adjacent surface conductors such that the interconnect conductor makes conductive contact with, and can transmit an electrical signal between, the adjacent surface conductors without modification of either surface conductor.

2. The device of claim 1 further comprising a microwave signal source to provide the electrical signal.

3. The device of claim 1 wherein one of the surface conductors is a microstrip electrically coupled to a coaxial input connector.

4. The device of claim 1 wherein the interconnect comprises a material with a low dielectric constant.

5. The device of claim 1 further comprising mounting pins attached to a surface on which a surface conductor is mounted, said interconnect having holes which fit over the pins to secure the interconnect.

6. A test fixture for making electrical contact with a substantially flat electrical device having a microstrip surface conductor, the test fixture comprising:
   a coaxial connector and a microstrip joined at a coaxial to microstrip transition, the microstrip being mounted to a working surface;
   a mounting slot recessed from the working surface for receiving the electrical device;
   an interconnect having a flexible body and a printed conductor on one side, the interconnect being removably securable to the working surface such that when secured, the interconnect overlaps a junction between the working surface and the mounting slot; and
   a pressure source external to the interconnect for applying direct pressure to portions of the interconnect over both the surface conductor of the device and the microstrip on the working surface, the pressure causing the body of the interconnect to bend into contact with the working surface and a device mounted in the mounting slot such that the printed conductor bridges an electrical path between the surface conductor on the device and the microstrip on the working surface without modification of the surface conductor of the device.

7. The test fixture of claim 6 wherein the pressure source comprises a contact piece formed of material having a low dielectric constant, the contact piece being movably secured to the test fixture such that when it moves into contact with the interconnect it provides said direct pressure to the side of the interconnect opposite the printed conductor.

8. The test fixture of claim 7 wherein the contact piece is mounted on a spring-loaded shaft.

9. The test fixture of claim 8 further comprising a lever and cam mechanism for moving the shaft to bring the contact piece in and out of contact with the interconnect.

10. The test fixture of claim 8 wherein the contact piece surface which contacts the interconnect is recessed in a center region such that said direct pressure is concentrated on chosen regions of the interconnect.

11. The test fixture of claim 6 further comprising an additional interconnect and additional pressure source for making contact between an additional fixture microstrip and an additional surface conductor on the electrical device.

12. The test fixture of claim 6 wherein the electrical device functions at microwave frequencies.

13. The test fixture of claim 6 wherein a portion of the working surface surrounding the microstrip is a material of a high dielectric constant.

14. The test fixture of claim 6 wherein the flexible interconnect has a plurality of printed conductors for making electrical connections between a plurality of fixture microstrips and surface conductors on the device.

15. The test fixture of claim 6 wherein the flexible interconnect has a plurality of printed conductors for making electrical connections between a plurality of fixture microstrips and the surface conductors of a plurality of devices mounted in the mounting slot.

16. The test fixture of claim 6 further comprising automated equipment which loads the electrical device in the mounting slot, moves the interconnect over said junction, and applies pressure to the interconnect.

17. A test fixture for making electrical contact with a substantially flat electrical device having surface conductors, comprising:
   a mounting body to which a removable fitting is mounted, the fitting having a first and a second coaxial connector electrically coupled to a first and a second microstrip, the microstrips being mounted to first and a second respective working surface on the fitting;
   a recessed mounting slot positioned between the working surfaces adjacent the two microstrips for receiving said electrical device;
   a first and a second flexible interconnect removably securable to the first and second working surfaces, respectively, such that when secured, each interconnect overlaps a junction between its respective working surface and the mounting slot, each interconnect having a printed conductor on the side facing the junction such that when it is pressed into engagement with the working surface and a device mounted in the mounting slot, the printed conductor bridges an electrical path between a surface conductor on the device and a microstrip, without modification of the surface conductor on the device;
   a first and a second spring-loaded pressure means each having a contact piece of low dielectric material for applying direct pressure to the first and second interconnects, respectively, each shaft being movably secured to the test fixture such that when it moves into contact with a respective interconnect it provides direct pressure to portions of the interconnect over both the surface conductor on the device and the microstrip on the working surface which the interconnect electrically connects.

18. A method of measuring the characteristics of an electronic device comprising:
   providing a test fixture having coaxial input connectors attached to coaxial test cables, each input connector being electrically coupled to a microstrip on the fixture which terminates on one side of a recessed carrier mounting slot in the test fixture;
   inserting a carrier into the mounting slot such that unmodified surface conductors on the carrier surface are aligned with the microstrips;
   providing flexible interconnects each having a conductor, the interconnects being removably secured to the test fixture such that one interconnect is on either side of the mounting slot adjacent a microstrip, each interconnect conductor facing a junction between the carrier and the fixture microstrip to which it is adjacent;
   applying pressure to each interconnect such that the interconnect conductor is pressed into conductive contact with a surface conductor on the carrier and a fixture microstrip, the pressure being direct pressure on a portion of the interconnect adjacent the surface conductor on the carrier and on a portion of the interconnect adjacent the microstrip; and
   applying test signals to the carrier device through the coaxial test cables.

* * * * *